United States Patent
Whieh

(10) Patent No.: US 6,274,883 B1
(45) Date of Patent: Aug. 14, 2001

(54) STRUCTURE OF A BALL GRID ARRAY SUBSTRATE WITH CHARTS FOR INDICATING POSITION OF DEFECTIVE CHIPS

(75) Inventor: W. L. Whieh, Taipei (TW)

(73) Assignee: Orient Semiconductor Electronics Ltd., Kaohsiung (TW)

( * ) Notice: Subject to any disclaimer, the term of this patent is extended or adjusted under 35 U.S.C. 154(b) by 0 days.

(21) Appl. No.: 09/459,490

(22) Filed: Dec. 13, 1999

(51) Int. Cl.[7] ................................................. H01L 23/58
(52) U.S. Cl. ............................................. 257/48; 257/798
(58) Field of Search .................. 257/48, 798; 438/14–18

(56) References Cited

U.S. PATENT DOCUMENTS

| | | |
|---|---|---|
| 3,615,463 | * 10/1971 | Kuschell . |
| 4,426,773 | * 1/1984 | Hargis . |
| 5,153,507 | * 10/1992 | Fong et al. . |
| 5,256,578 | * 10/1993 | Corely et al. . |

* cited by examiner

Primary Examiner—David E. Graybill
(74) Attorney, Agent, or Firm—A & J

(57) ABSTRACT

A ball grid array substrate includes a circumferential edge provided with a plurality of charts each having a plurality of lattices corresponding to positions of chips on the ball grid array substrate for indicating positions of defective chips in different packaging procedures whereby positions of the defective chips can be easily observed.

1 Claim, 5 Drawing Sheets

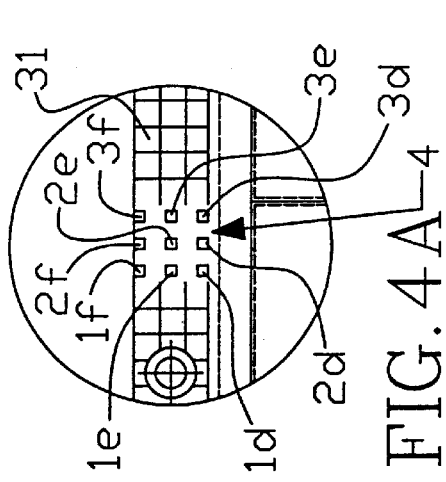
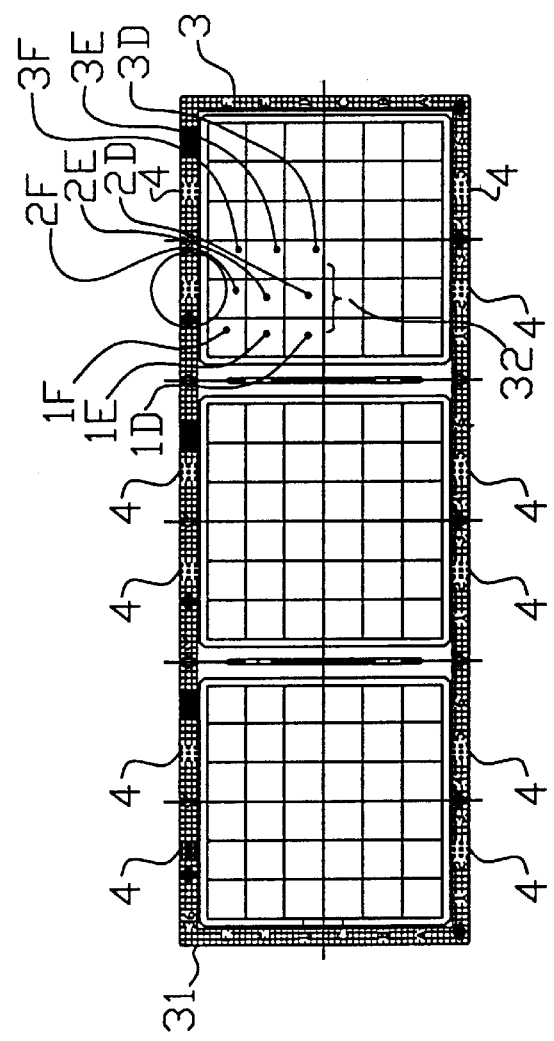

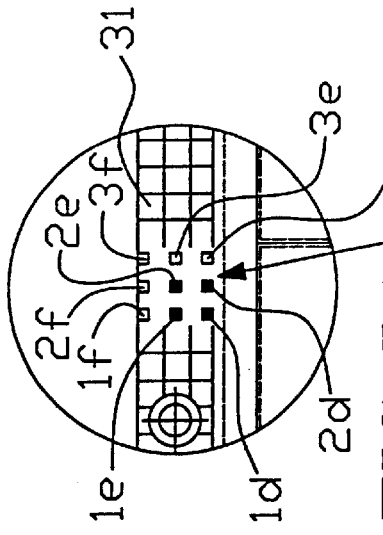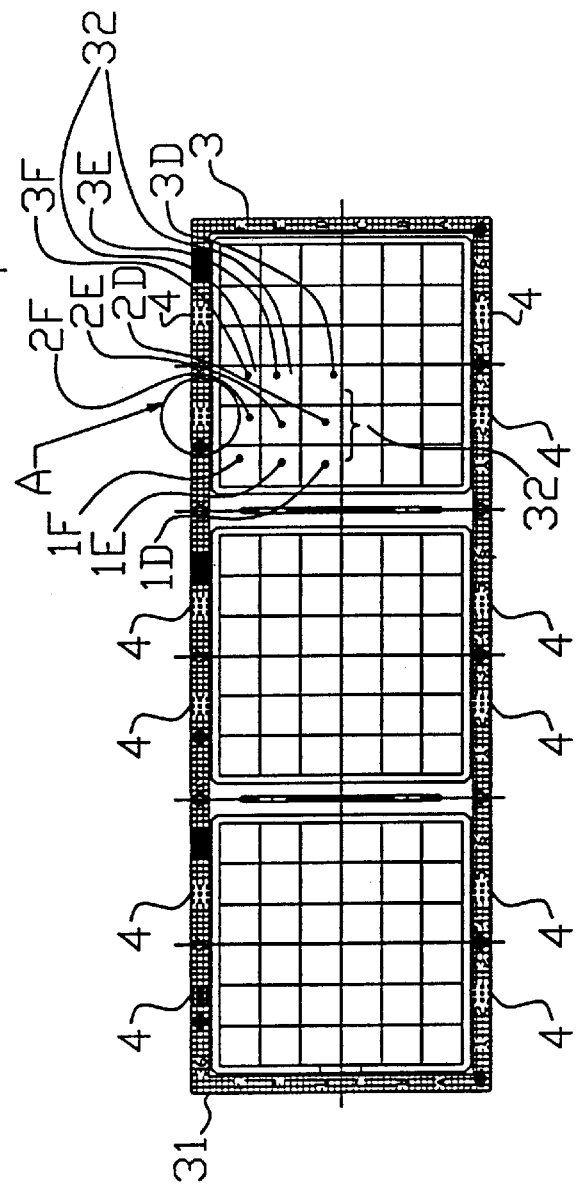

STRUCTURE OF A BALL GRID ARRAY SUBSTRATE WITH CHARTS FOR INDICATING POSITION OF DEFECTIVE CHIPS

BACKGROUND OF THE INVENTION

1. Field of the Invention

This invention is related to an improvement in the structure of a ball grid array substrate and in particular to one having charts for indicating the position of defective chips.

2. Description of the Prior Art

Referring to FIGS. 1 and 2, a label 2 must be used for indicating the position of defective chips on the conventional ball grid array substrate 1 at each of the processing stations. However, it is not only ineconomical to mark the relative positions 21 of the defective chips on the label 2, but also easy for an operator to make mistakes in marking the relative positions of the defective chips, thereby worsening the quality control. In addition, such marking operation must be performed by manual power thus increasing the labor cost.

Therefore, it is an object of the present invention to provide an improved structure of a ball grid array substrate which can obviate and mitigate the above-mentioned drawbacks.

SUMMARY OF THE INVENTION

This invention is related to the structure of a ball grid array substrate with charts for indicating the position of defective chips.

According to a preferred embodiment of the present invention, a ball grid array substrate includes a circumferential edge provided with a plurality of charts each having a plurality of lattices corresponding to positions of chips on the ball grid array substrate for indicating positions of defective chips in different packaging procedures.

It is the primary object of the present invention to provide a ball grid array substrate with charts for indicating the positions of defective chips which can reduce the operation cost.

It is another object of the present invention to provide a ball grid array substrate with charts for indicating positions of defective chips which enables an operator to observe easily whether the chip is good or defective.

It is still another object of the present invention to provide a ball grid array substrate with charts for indicating the position of defective chips which is fit for mass production.

It is still another object of the present invention to provide a ball grid array substrate with charts for indicating the position of defective chips which can reduce the time required for packaging the chips.

It is a further object of the present invention to provide a ball grid array substrate with charts for indicating the position of defective chips which is simple in construction and low in cost.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts. Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIG. 4 illustrates a ball grid array substrate with charts for indicating defective chips according to the present invention;

FIG. 4A is an enlarged fragmentary view of FIG. 4;

FIG. 5 illustrates how to mark the relative positions of the defective chips according to the present invention; and FIG. 5A is an enlarged fragmentary view of FIG. 5.

DETAILED DESCRIPTION OF THE PREFERRED EMBODIMENT

Figure 1:
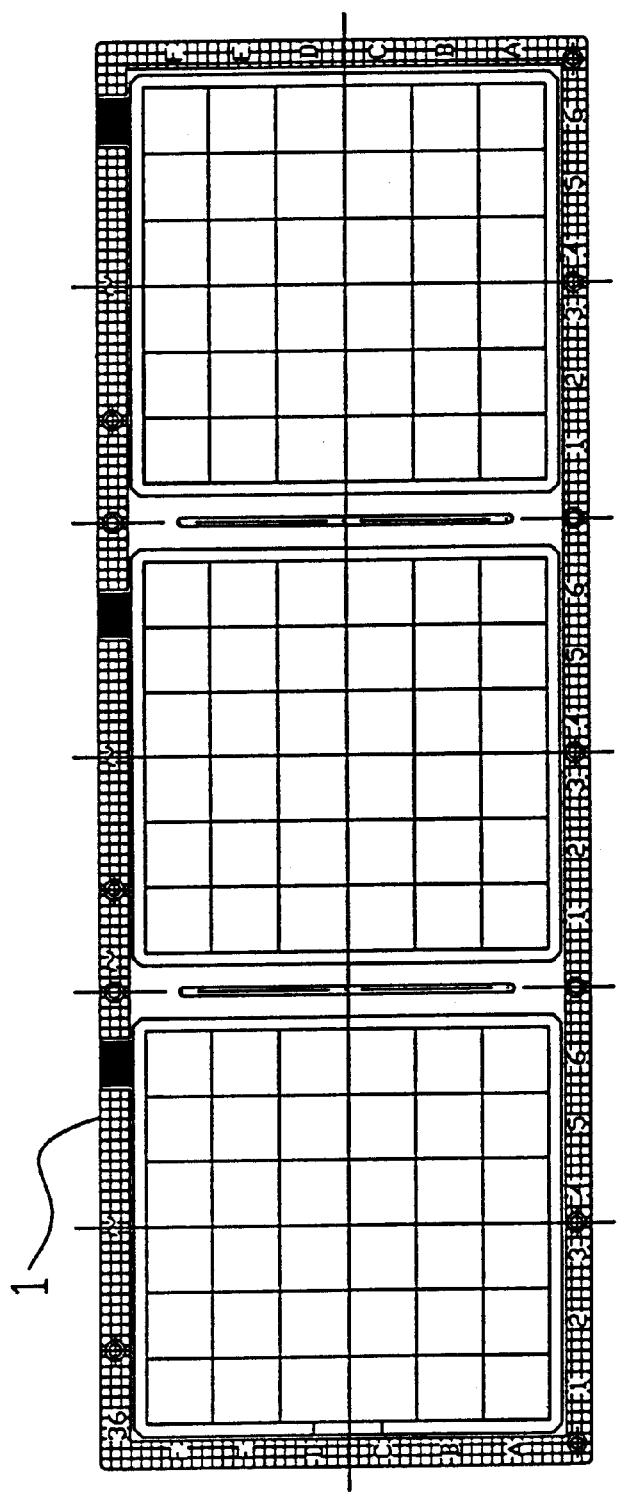
FIG. 1 illustrates a prior art ball grid array substrate.
Figure 2:
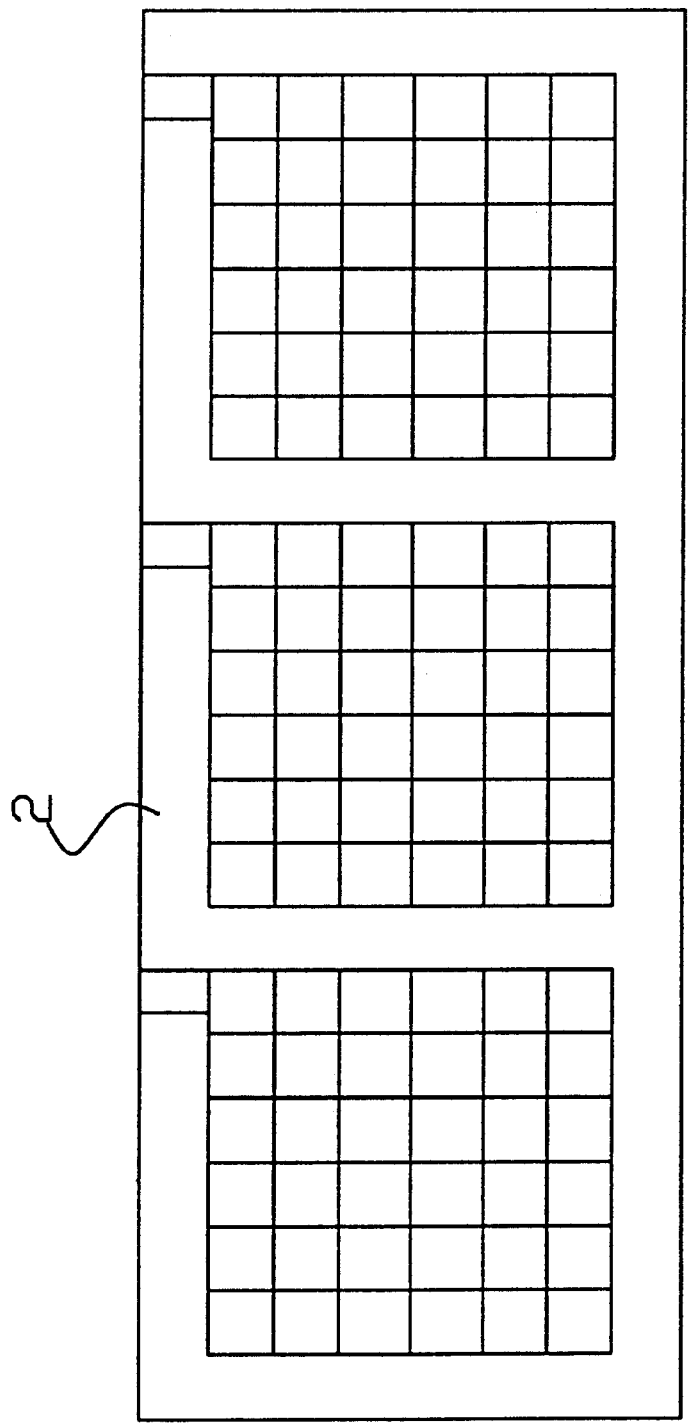
FIG. 2 illustrates a prior art label for indicating defective chips of ball grid array substrates.
Figure 3:
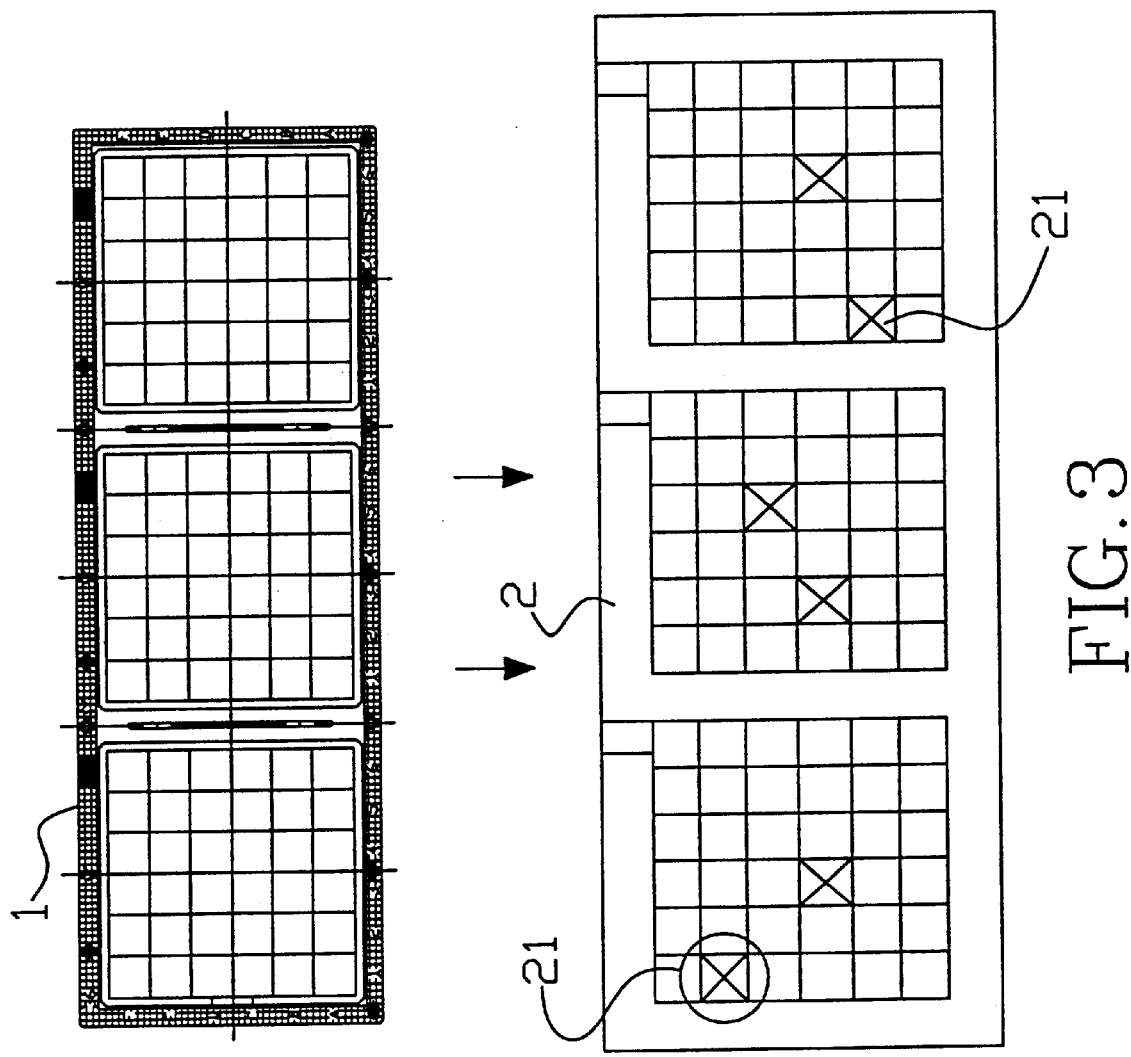
FIG. 3 illustrates how to mark the relative positions of the defective chips on the label.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

With reference to the drawings and in particular to FIGS. 4 and 4A, the ball grid array substrate 3 according to the present invention comprises a circumferential edge 31 on which there are a plurality of charts 4 for indicating the relative positions of defective chips. The charts 4 are provided on the circumferential edge 31 when the ball grid array substrate 3 is manufactured (see FIGS. 5 and 5A). As shown, the ball grid array substrate 3 has zones 1D, 2D, 3D, 1E, 2E, 3E, 1F, 2F and 3F which correspond to lattices $1d$, $2d$, $3d$, $1e$, $2e$, $3e$, $1f$, $2f$ and $3f$ of the chart 4. If the zones 1D, 2D, 1E and 2E of the ball grid array substrate 3 are defective, the operator may manually or use a machine (not shown) to put marks on the corresponding lattices of the chart 4, thereby clearly marking the positions of the defective chips during different packaging procedures and therefore accurately indicating the positions of the defective chips 32.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A ball grid array substrate comprising a circumferential edge provided with a plurality of charts each having a plurality of lattices corresponding to positions of chips on said ball grid array substrate for indicating positions of defective chips in different packaging procedures whereby positions of said defective chips can be easily observed.

* * * * *